United States Patent
Kwon

(10) Patent No.: US 7,145,493 B2
(45) Date of Patent: Dec. 5, 2006

(54) DIGITAL-TO-ANALOG CONVERTER (DAC) CIRCUITS USING DIFFERENT CURRENTS FOR CALIBRATION BIASING AND METHODS OF OPERATING SAME

(75) Inventor: Kee-Won Kwon, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 13 days.

(21) Appl. No.: 11/141,536

(22) Filed: May 31, 2005

(65) Prior Publication Data
US 2005/0270208 A1    Dec. 8, 2005

(30) Foreign Application Priority Data
Jun. 4, 2004   (KR) ............... 10-2004-0040902

(51) Int. Cl.
*H03M 1/66* (2006.01)

(52) U.S. Cl. .................. 341/144; 341/135

(58) Field of Classification Search ......... 341/120–150
See application file for complete search history.

(56) References Cited

U.S. PATENT DOCUMENTS

| 5,283,580 A | * | 2/1994 | Brooks et al. | 341/145 |
| 6,424,276 B1 | | 7/2002 | Munoz et al. | |
| 6,952,177 B1 | * | 10/2005 | Hitko | 341/144 |
| 6,967,609 B1 | * | 11/2005 | Bicakci et al. | 341/144 |

FOREIGN PATENT DOCUMENTS

| JP | 2003-298418 | 10/2003 |
| KR | 10/2001/0026158 A | 4/2001 |
| KR | 10-2002-0014522 A | 2/2002 |

* cited by examiner

*Primary Examiner*—Lam T. Mai
(74) *Attorney, Agent, or Firm*—Myers Bigel Sibley & Sajovec, P.A.

(57) ABSTRACT

A DAC circuit can include a plurality of current source circuits configured to operate responsive to respective different bias voltage signals and respective true and complementary binary digit signals.

17 Claims, 3 Drawing Sheets

DIGITAL-TO-ANALOG CONVERTER (DAC) CIRCUITS USING DIFFERENT CURRENTS FOR CALIBRATION BIASING AND METHODS OF OPERATING SAME

CROSS-REFERENCE TO RELATED APPLICATION

This application claims the priority of Korean Patent Application No. 10-2004-0040902, filed on Jun. 4, 2004, in the Korean Intellectual Property Office, the disclosure of which is incorporated herein in its entirety by reference.

FIELD OF THE INVENTION

The invention relates to digital-to-analog converters (DACs), and more particularly, to the calibration of DACs.

BACKGROUND

It is known that bandwidth and resolution are parameters that can affect the performance of a Digital to Analog Converter (DAC) circuit. Bandwidth may be improved by parallel processing. However, processing variables, such as temperature, voltage, and the like, may present difficulties in improving the resolution of a DAC. For example, when a DAC has a resolution greater than 10 bits, the complexity (and the price) of the DAC may increase significantly.

In addition, after manufacturing the DAC, a trimming process may be used to compensate for the processing variables. For example, some conventional processes use a laser to calibrate the DAC by trimming resistor structures to adjust the values thereof. Accordingly, the space occupied by the trimmed components may not be used for other purposes. Furthermore, the cost of manufacturing the DAC may increase because the resistors that are to be trimmed are manufactured to have a large size to increase the resolution of the DAC.

SUMMARY

Embodiments according to the invention can provide Digital-to-Analog Converter (DAC) circuits using different currents for calibration biasing and methods of operating same. Pursuant to these embodiments, a DAC circuit can include a plurality of current source circuits configured to operate responsive to respective different bias voltage signals and respective true and complementary binary digit signals. In some embodiments according to the invention, the respective different bias voltage signals provide for different currents generated by the plurality of current source circuits.

In some embodiments according to the invention, the DAC further includes a plurality of bias voltage generators coupled to the plurality of current source circuits and configured to generate the respective different bias voltage signals. In some embodiments according to the invention, the plurality of bias voltage generators include a respective plurality of Successive Approximation Registers configured to store respective values corresponding to the respective different bias voltage signals generated by the plurality of bias voltage generators.

In some embodiments according to the invention, the DAC further includes a comparator circuit configured to generate a feedback signal output therefrom based on an input voltage signal generated by the plurality of current source circuits during a calibration cycle of a respective one of the plurality of current source circuits and based on a calibration reference voltage signal having a value corresponding to the respective one of the plurality of current source circuits.

In some embodiments according to the invention, the calibration reference voltage signal is configured to change in cooperation with changes in the value in the respective one of the plurality of Successive Approximation Registers included in the respective one of the plurality of bias voltage generators. In some embodiments according to the invention, the respective values stored in the respective plurality of Successive Approximation Registers are generated based on the feedback signal over a plurality of calibration cycles for the plurality of current source circuits.

In some embodiments according to the invention, the comparator circuit is further configured to generate the feedback signal during normal operation based on an input voltage signal generated by the plurality of current source circuits using values stored in the Successive Approximation Registers during calibration and based on the respective true and complementary binary digit signals.

In some embodiments according to the invention, the DAC further includes a multiplexer circuit having an output coupled to an input of the comparator circuit, wherein the multiplexer circuit is configured to selectively provide the calibration reference voltage signal to the comparator during the calibration cycle or a power supply voltage level to the comparator during normal operation.

In some embodiments according to the invention, the DAC further includes a feedback element, such as a resistor or a capacitor, is coupled between the output of the comparator circuit and the plurality of current source circuits at an input of the comparator circuit.

In some embodiments according to the invention, a DAC circuit includes a plurality of bias voltage generators configured to generate respective different bias voltage signals based on respective values in respective Successive Approximation Registers. A plurality of current source circuits is coupled to respective ones of the plurality of bias voltage generators via the respective different bias voltage signals and configured to source different currents responsive to the different bias voltage signals to provide components of a voltage signal output therefrom based on respective true and complementary binary digit signals input to the DAC circuit. A multiplexer circuit has an output therefrom that is selected from a calibration reference voltage signal and a power supply voltage level at the inputs thereto. A comparator circuit is coupled to the voltage signal output from the plurality of current source circuits and is coupled to the multiplexer circuit, the comparator circuit configured to generate a feedback signal output therefrom based on the voltage signal and the calibration reference voltage signal to provide a feedback signal therefrom that indicates whether the respective one of the value stored in the respective Successive Approximation Register is to be increased or decreased for a subsequent calibration cycle.

In some embodiments according to the invention, the DAC further includes a feedback element, such as a resistor or a capacitor, is coupled between the output of the feedback signal and the plurality of current source circuits at an input of the comparator circuit.

In some embodiments according to the invention, a method of operating a DAC circuit includes providing different biasing voltage signals to different stages of the DAC circuit during normal operations thereof responsive to binary digit signals applied to the different stages.

In some embodiments according to the invention, the different biasing voltage signals are determined through a series of calibration cycles for the stages of the DAC circuit using successive approximation to equalize a voltage signal generated by a signal generation circuit responsive to the binary digit signals with a calibration reference voltage signal associated with each of the stages.

In some embodiments according to the invention, the method further includes storing respective values associated with equalizing a respective voltage signal with a respective calibration reference voltage signal in a Successive Approximation Register associated with respective bias voltage generators configured to provide a the different biasing voltage signals to the different stages.

In some embodiments according to the invention, a method of operating a DAC circuit includes successively adjusting a biasing voltage signal to a stage of the DAC circuit responsive to a feedback signal generated during successive calibration cycles wherein a calibration reference voltage signal is compared to a series of voltage levels generated by the stage responsive to the successively adjusted biasing voltage signal.

In some embodiments according to the invention, the method further includes storing a value associated with the biasing voltage signal that generates an input voltage signal that is about equal to the calibration reference voltage signal in a Successive Approximation Register associated with the stage.

In some embodiments according to the invention, the calibration reference voltage signal is a first calibration reference voltage signal and the method further includes repeating the successively adjusting the biasing voltage signal for other stages of the DAC circuit using other different calibration reference voltage signals.

In some embodiments according to the invention, the method further includes storing a other values associated with the biasing voltage signals that generate input voltage signals that are about equal to the other different calibration reference voltage signals applied to the different stages in respective Successive Approximation Register associated with the different stages.

In some embodiments according to the invention, the method further includes selecting a power supply voltage to be compared to an input voltage signal generated responsive to a binary digit signal applied to a current source circuit having the biasing voltage signal generated by the stored value during normal operation of the DAC.

In some embodiments according to the invention, a DAC circuit includes a current source circuit configured to operate responsive to a bias voltage signal determined during calibration.

Figure 1:
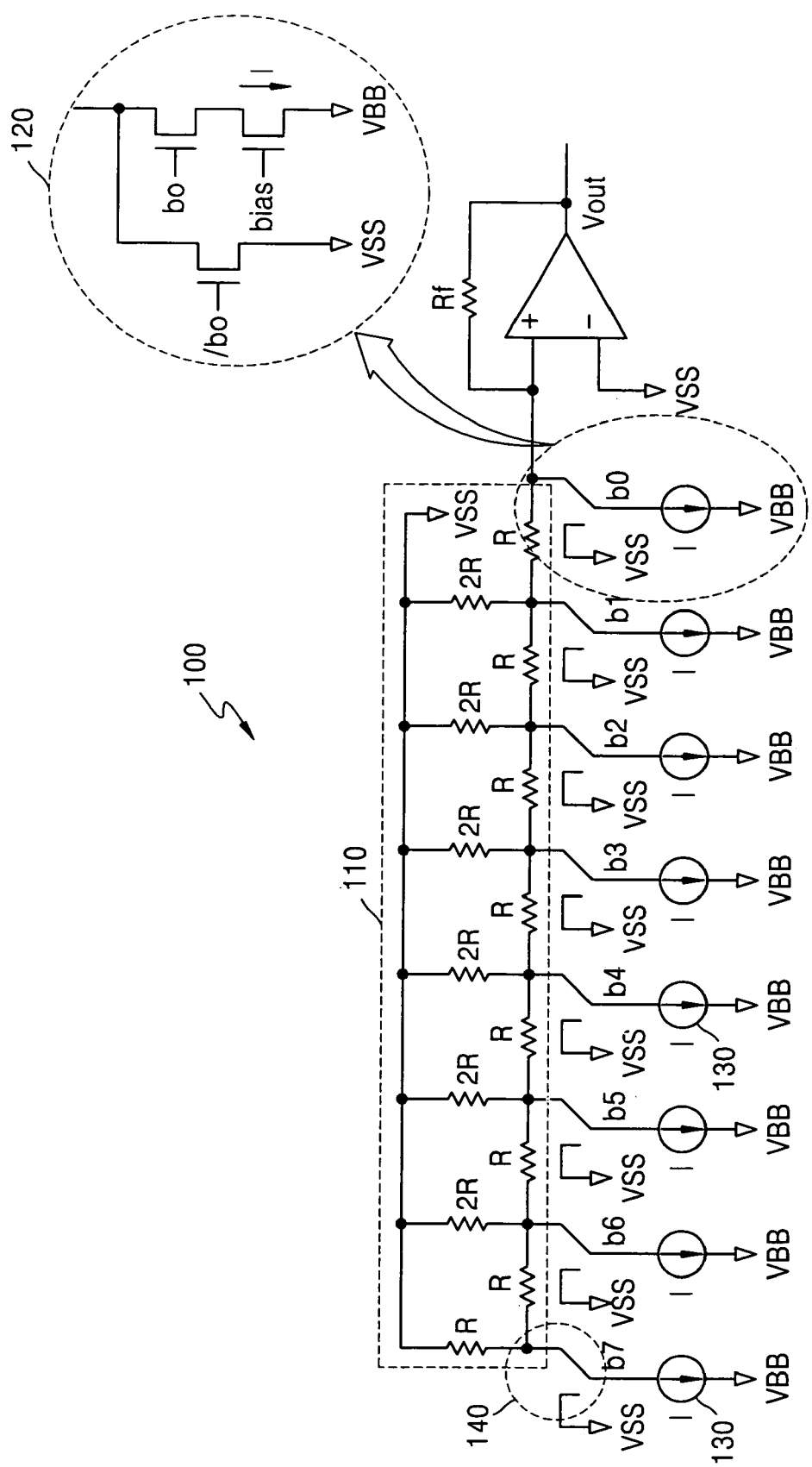
FIG. 1 is a circuit diagram of a conventional digital-to-analog converter.

DESCRIPTION OF EMBODIMENTS
ACCORDING TO THE INVENTION

The invention is further described hereinafter with reference to the accompanying figures, in which embodiments of the invention are shown. This invention may, however, be embodied in many alternate forms and should not be construed as limited to the embodiments set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be understood that, although the terms first, second, etc. may be used herein to describe various elements, these elements should not be limited by these terms. These terms are only used to distinguish one element from another. For example, a first portion could be termed a second portion, and, similarly, a second portion could be termed a first portion without departing from the teachings of the disclosure.

FIG. 1 is a circuit diagram of a conventional digital-to-analog converter (DAC) 100. The DAC 100 includes a conventional R-2R ladder. Here, VSS denotes a positive power source (i.e., a positive power supply voltage), and VBB denotes a negative power source (i.e., a negative power supply voltage).

According to FIG. 1, current I, of the same magnitude flows through each of a plurality of current sources 130. A digital input (binary digit) signal is represented by $b_0$ through $b_7$. The enlarged portion 120 includes three transistors that receive one of the digital input signals $b_0$ and $/b_0$, and a bias voltage signal "bias."

Variations between the current sources 130, the resistors R and 2R, and/or the resistances of the switches 140 can affect the operation of the DAC 100 and can contribute to a differential noise level (DNL) and/or an integral noise level (INL) in the DAC 100. In particular, it may be difficult to provide adequate performance in a DAC with a resolution of more than 10 bits unless the DAC is calibrated to compensate for these variations. One conventional approach is to trim the resistors R and 2R using a laser to compensate for these variables.

For example, to calibrate the most significant bit (MSB) of an 18 bit DAC and maintain INL/DNL of 0.5 least significant bits (LSB), the resolution of the laser trimming may need to be about 2 ppm. Thus, a high quality laser trimmer may be needed. Moreover, the time needed to trim the resistors may lengthen the fabrication process. Since the precision of the trimming process is determined by trimming portions of the medium that provides the resistors, the size of the medium may need to be oversized. Moreover, higher resolution DACs may need to include even larger areas for the components to be trimmed to allow for greater adjustments.

As appreciated by the present inventors, a DAC circuit according to some embodiments including the invention, which are further described below, the need for trimming can be reduced by applying a bias voltage signal to a current source circuit (e.g., via a gate of the current source circuit) to calibrate the DAC to compensate for the types of variations described herein.

Figure 2:
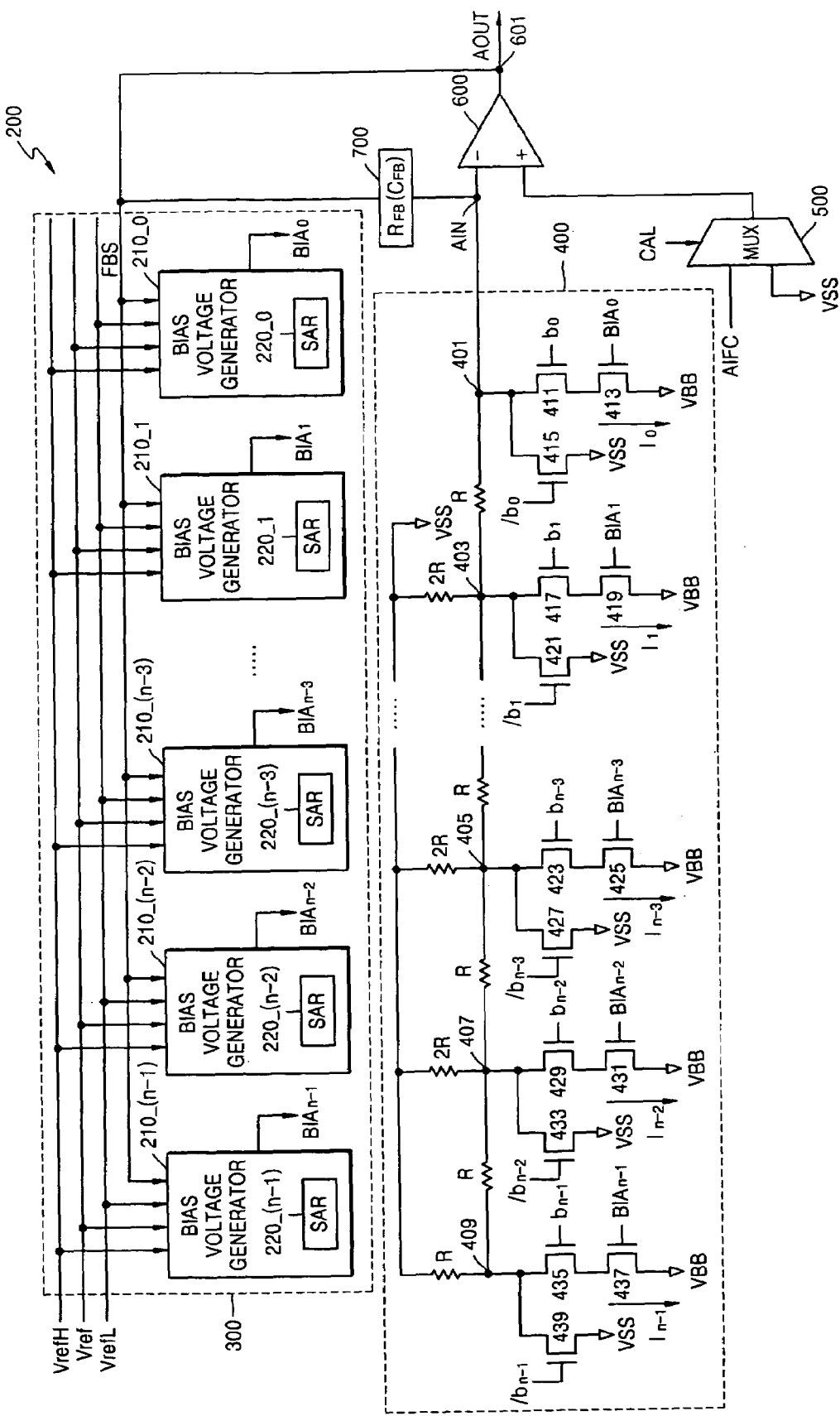
FIG. 2 is a circuit diagram that illustrates a digital-to-analog converter circuit according to some embodiments of the invention.

FIG. 2 is a circuit diagram of a DAC circuit 200 having a calibration circuit according to some embodiments including the present invention. The DAC circuit 200 includes a bias voltage generation circuit 300, a signal generation circuit 400, a selection circuit 500, a comparator 600, and a resistor 700.

The bias voltage generation circuit 300 comprises a plurality of bias voltage generators 210_0 through 210_(n-1). The bias voltage generators 210_0 through 210_(n-1) include Successive Approximation Registers (SAR) 220_0 through 220_(n-1), respectively. The bias voltage generators 210_0 through 210_(n-1) can generate different bias voltage signals BIA0 through BIAn-1 responsive to a plurality of reference voltages VrefL, Vref, and VrefH, and a control signal FBS.

The plurality of reference voltages VrefL, Vref, and VrefH are generated by a reference voltage generator (not shown). Bias voltages signals BIA0 through BIAn-1 are input to corresponding transistors 413, 419, ..., 425, 431, and 437, respectively included in respective current source circuits 205. It will be understood that although only one current source circuit 205 is shown, the reference numeral 205 actually refers to the other current source circuits coupled to the remaining bias voltage generators 210_0 through 210_(n-2).

In some embodiments according to the invention, the number of bits in each of the SARs 220_0 through 220_(n-1) is different. For example, the SAR 200_(n-1) includes (n-1) bits, the SAR 200 _(n-2) includes (n-2) bits, and the SAR 220_1 includes 1 bit. In addition, since the SAR 220_0 includes 0 bits, the bias voltage $BIA_0$ is the same as the reference voltage Vref. The plurality of SARs 220_0 through 220_(n-1) are configured to store values that correspond to the respective bias voltage signals BIA0 through BIAn-1 that are provided to the plurality of current source circuits 205. Further operations of the SARs 220_0 through 220_(n-1) will be described in more detail with reference to FIG. 3. However, further description of the structure and function of the SARs are omitted since SARs are well known to those skilled in the art.

The signal generation circuit 400 comprises an R-2R ladder including a plurality of resistors R and R2 and the plurality of current source circuits 205 each including a plurality of transistors. True versions of binary digit signals $b_0$ through $b_{n-1}$ are input to the gates of the corresponding transistors 411, 417, ..., 423, 429, and 435, and complementary versions of the binary digit signals $/b_0$ through $/b_{n-1}$ are input to the gates of corresponding transistors 415, 421, ..., 427, 433, and 439. For example, $b_i$ and $/b_i$ (wherein, "i" is an integer) are complementary to each other. In some embodiments according to the invention, the resistors R and 2R can be replaced with capacitors C and 2C, respectively.

The transistors 413, 419, ..., 425, 431, and 437 operate responsive to the plurality of different bias voltage signals generated by the plurality of bias voltage generators 210_0 through 210_(n-1) based on the values stored in the respective SARs 220_0 through 220_(n-1). The plurality of different bias voltage signals $BIA_0$ through $BIA_{n-1}$ cause the plurality of current source circuits 205 to generate different currents $I_0$ through $I_{n-1}$ that flow to a negative power supply voltage VBB. The different currents $I_0$ through $I_{n-1}$ cause corresponding voltage signals to develop at the nodes 401–409, which combine to provide a voltage input signal to an input AIN of the comparator circuit 600 (i.e., the negative terminal (−)).

The positive terminal (+) of the comparator circuit 600 receives either a power voltage VSS or an analog input signal AIFC (calibration reference voltage signal) for use during calibration cycles depending on the state of the selection signal CAL. For example, when the DAC circuit 200 operates normally, the selection circuit 500 provides the power supply voltage VSS to the "+" input terminal of the comparator circuit 600. However, during calibration of the DAC circuit 200, the selection circuit 500 provides the analog input signal AIFC to the "+" terminal of the comparator circuit 600. In some embodiments according to the invention, the selection circuit 500 is a multiplexer circuit (MUX).

The comparator circuit 600 receives the voltage signal AIN at the "−" terminal, which the comparator circuit 600 compares to the output signal VSS or the AIFC voltage signal provided by the selection circuit 500 and outputs the comparison as the AOUT signal at an output node 601.

The resistor (feedback element) 700 is coupled between the negative terminal of the comparator circuit 600 at node 401 and the output node 601. In some embodiments according to the invention, the feedback element can be a capacitor CFB. Therefore, the output node 601, the resistor 700, and the input node 401 of the comparator 600 define a feedback loop for the comparator circuit 600. The AOUT signal is also provided as a control signal (feedback signal) FBS across the resistor 700.

Figure 3:
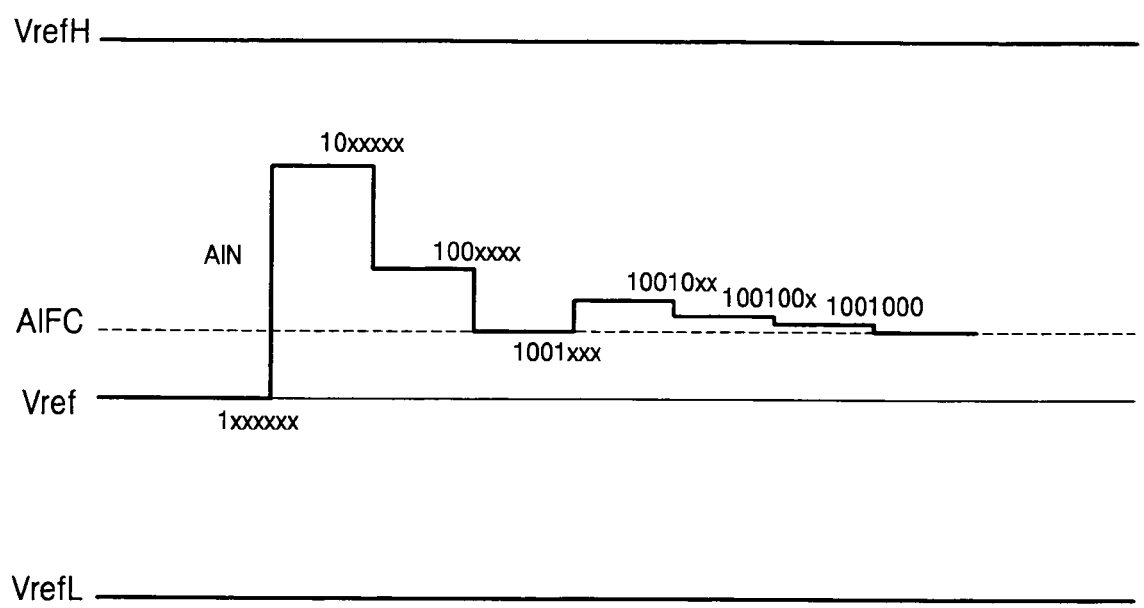
FIG. 3 is a timing diagram that illustrates exemplary operations of the DAC circuit illustrated in FIG. 2 according to some embodiments of the invention.

FIG. 3 is a timing diagram of a calibration cycle for the SAR 220_(n-1) illustrated in FIG. 2. Referring to FIGS. 2 and 3, it is assumed that the reference voltage Vref is about midway between the reference voltages VrefH and VrefL, the resolution of the DAC circuit is n (=8 bits), and SARs 220_0 through 220_(n-1) are each in an initial (or reset) state. According to FIGS. 2 and 3, in some embodiments according to the invention, the value to be stored in the SAR 220_(n-1) is determined as follows, assuming that a binary digital signal $b_{n-1}$ is 1. The selection circuit 500 responds to the selection signal CAL and outputs the analog input signal AIFC to the "+" terminal of the comparator circuit 600. In some embodiments according to the invention, the analog input signal AIFC is the voltage level expected at the AIN node 401 when $b_{n-1}$=1.

The comparator circuit 600 compares the voltage signal at the AIN node 401 to the analog input signal AIFC, and generates the control signal FBS according to the comparison results. The bias voltage generator 210_(n-1) generates a bias voltage $BIA_{n-1}$ corresponding to 1XXXXXX, based on the reference signals VrefL, Vref, and VrefH, and the control signal FBS. In other words, the bias voltage generator 210_(n−1) increases or decreases the bias voltage signal to the current source circuit 205 based on the state of the FSB. In particular, the transistor 437 generates the bias current $I_{n-1}$ in response to the bias voltage signal $BIA_{n-1}$ corresponding to 1XXXXXX, which develops the voltage signal AIN at the node 401 across the R-2R ladder in response to the current $I_{n-1}$ through transistors 435 and 437.

The comparator circuit 600 compares the voltage at the "−" terminal generated by the bias voltage signal $BIA_{n-1}$ provided by the SAR 220_(n−1) value of 1XXXXXX and the analog input signal AIFC, and adjusts the control signal FBS according to the new comparison result.

The bias voltage generator 210_(n−1) generates an adjusted bias voltage signal $BIA_{n-1}$ corresponding to the SAR 220_(n−1) of 10XXXXX, based on the adjusted control signal FBS generated by the bias voltage $BIA_{n-1}$ that corresponds to 1XXXXXX. Therefore, the transistor 437 generates a bias current In−1 in response to the bias voltage $BIA_{n-1}$ corresponding to the SAR 220_(n−1) value of 10XXXXX. The voltage AIN of the node 409 or 401 is determined by the resistance of the R-2R ladder and the transistors 435 and 437.

The comparator circuit 600 compares the voltage at the "−" terminal generated by the adjusted bias voltage $BIA_{n-1}$ corresponding to 10XXXXX and the analog input signal AIFC, and generates the adjusted control signal FBS according to the comparison result.

The bias voltage generator 210_(n−1) generates an adjusted bias voltage signal $BIA_{n-1}$ corresponding to the SAR 220_(n−1) value of 100XXXX based on the bias voltage $BIA_{n-1}$ corresponding to 10XXXXX, from the adjusted control signal FBS.

By the same method as described above, the bias voltage generator 210_(n−1) generates a bias voltage $BIA_{n-1}$ corresponding to the SAR 220_(n−1) value of 1001XXX, based on the adjusted control signal FBS generated by the bias voltage $BIA_{n-1}$ corresponding to the SAR 220_(n−1) value of 100XXXX. Consequently, the bias voltage generator 210_(n−1) generates a bias voltage $BIA_{n-1}$ corresponding to the SAR 220_(n−1) values of 10010XX, 100100X, and 1001000, consecutively based on the repeatedly adjusted control signal FBS output from the comparator circuit 600.

The state (e.g., low) of the output signal AOUT of the comparator circuit 600 in response to the bias voltage $BIA_{n-1}$ corresponding to the SAR 220_(n−1) value of 1001000 is different than the state (e.g., high) of the output signal AOUT of the comparator circuit 600 in response to the bias voltage signal $BIA_{n-1}$ corresponding to the SAR 220_(n−1) values of 1XXXXXX, 10XXXXX, 100XXXX, 1001 XXX, 10010XX, and 100100X. Therefore, the SAR 220_(n−1) stores a value of 1001000 obtained through the calibration cycles described above as this value has been successively approximated to generate a voltage signal at the AIN 401 that is equal to the corresponding value of the analog input signal AIFC. When the DAC circuit 200 operates normally, the bias voltage generator 220_(n−1) outputs a bias voltage signal $BIA_{n-1}$ corresponding to a SAR 220_(n−1) value of 1001000 to the gate of the transistor 437 included in the current source circuit 205.

The method of setting 6-bit SAR 220_(n−2) is substantially the same as the approach used to determine the 7-bit SAR 220_(n−1). Here, the analog input signal AIFC is the value of an analog signal corresponding to $b_{n-2}$. The method setting 5 bits SAR 220_(n−3) is substantially the same as the approach used to determine the 7-bit SAR 220_(n−1). Here, the analog input signal AIFC is the value of an analog signal corresponding to $b_{n-3}$. Further, the approach used to determine the 1 bit SAR 220_1 is substantially the same as the approach used to determine the 7-bit SAR 220_(n−1). Here, the analog input signal AIFC is the value of an analog signal that corresponds to $b_1$.

Accordingly, SAR 220_0 through 220_(n−1) each store the respective SAR 220 value (e.g., 1001000, etc.) determined during the calibration cycle for the respective stage of the DAC circuit 200. During operation of the DAC circuit 200, each of the plurality of current source circuits is provided with a different bias voltage signal, which generates a different current in each of the current source circuits. The size in bits of each of the codes is different to one another.

When the DAC circuit 200 operates normally, the selection circuit 500 outputs the power voltage VSS in response to the selection signal CAL. Therefore, the voltage AIN of the node 401 is decided based on the state of digital input signals $b_0$ through $b_{n-1}$ and $/b_0$ through $/b_{n-1}$, and the bias voltages signals $BIA_0$ through $BIA_{n-1}$ provided by the SAR 220 values, and the resistance of the R-2R ladder (or the capacitance of a C-C2 ladder).

The comparator circuit 600 compares the voltage AIN at the node 401 provided by the circuits described above, and the power voltage VSS, and outputs the results AOUT. The DAC circuit 200 according to the present invention uses the bias voltages $BIA_0$ through $BIA_{n-1}$ for the calibration cycles. In operation, a digital input signal can be converted into an analog output by comparing an analog input signal and a digital input signal, to generate a control signal. A plurality of bias voltage generators each having corresponding SARs generate corresponding bias voltage signals based on reference signals and the control signal. Codes indicating the generated bias voltages are stored in the respective SARs. The comparator compares a signal generated based on the digital input signal and the plurality of bias voltage signals, and a ground signal, and generates the analog output signal as the comparison result.

A DAC circuit according to some embodiments of the invention can be calibrated without necessarily using a device for trimming. Also, the space otherwise allocated to the components to be trimmed may be use for other purposes, which may improve the efficiency of the fabrication of the DAC circuit.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed:

1. A Digital-to-Analog Converter (DAC) circuit comprising:
a plurality of current source circuits configured to operate responsive to respective different bias voltage signals and respective true and complementary binary digit signals; and
a plurality of bias voltage generators coupled to the plurality of current source circuits and configured to generate the respective different bias voltage signals, wherein the plurality of bias voltage generators comprise a respective plurality of Successive Approximation Registers configured to store respective values corresponding to the respective different bias voltage signals generated by the plurality of bias voltage generators.

2. A DAC circuit according to claim 1 wherein the respective different bias voltage signals provide for different currents generated by the plurality of current source circuits.

3. A DAC circuit according to claim 1 further comprising:
a comparator circuit configured to generate a feedback signal output therefrom based on an input voltage signal generated by the plurality of current source circuits during a calibration cycle of a respective one of the plurality of current source circuits and based on a calibration reference voltage signal having a value corresponding to the respective one of the plurality of current source circuits.

4. A DAC circuit according to claim 3 wherein the calibration reference voltage signal is configured to change in cooperation with changes in the value in the respective one of the plurality of Successive Approximation Registers included in the respective one of the plurality of bias voltage generators.

5. A DAC circuit according to claim 3 wherein the respective values stored in the respective plurality of Successive Approximation Registers are generated based on the feedback signal over a plurality of calibration cycles for the plurality of current source circuits.

6. A DAC circuit according to claim 3 wherein the comparator circuit is further configured to generate the feedback signal during normal operation based on an input voltage signal generated by the plurality of current source circuits using values stored in the Successive Approximation Registers during calibration and based on the respective true and complementary binary digit signals.

7. A DAC circuit according to claim 3 further comprising:
a multiplexer circuit having an output coupled to an input of the comparator circuit, wherein the multiplexer circuit is configured to selectively provide the calibration reference voltage signal to the comparator during the calibration cycle or a power supply voltage level to the comparator during normal operation.

8. A DAC circuit according to claim 3 further comprising:
a feedback element, comprising a resistor or a capacitor, coupled between the output of the comparator circuit and the plurality of current source circuits at an input of the comparator circuit.

9. A Digital-to-Analog Converter (DAC) circuit comprising:
a plurality of bias voltage generators configured to generate respective different bias voltage signals based on respective values in respective Successive Approximation Registers;
a plurality of current source circuits coupled to respective ones of the plurality of bias voltage generators via the respective different bias voltage signals and configured to source different currents responsive to the different bias voltage signals to provide components of a voltage signal output therefrom based on respective true and complementary binary digit signals input to the DAC circuit;
a multiplexer circuit having an output therefrom selected from a calibration reference voltage signal and a power supply voltage level at the inputs thereto; and
a comparator circuit, coupled to the voltage signal output from the plurality of current source circuits and coupled to the multiplexer circuit, the comparator circuit configured to generate a feedback signal output therefrom based on the voltage signal and the calibration reference voltage signal to provide a feedback signal therefrom that indicates whether the respective one of the value stored in the respective Successive Approximation Register is to be increased or decreased for a subsequent calibration cycle.

10. A DAC circuit according to claim 9 further comprising:
a feedback element, comprising a resistor or a capacitor, coupled between the output of the feedback signal and the plurality of current source circuits at an input of the comparator circuit.

11. A method of operating a Digital-to-Analog Converter (DAC) circuit comprising:
providing different biasing voltage signals to different stages of the DAC circuit during normal operations thereof responsive to binary digit signals applied to the different stages; and
storing respective values associated with equalizing a respective voltage signal with a respective calibration reference voltage signal in a Successive Approximation Register associated with respective bias voltage generators configured to provide different biasing voltage signals to the different stages.

12. A method according to claim 11 wherein the different biasing voltage signals are determined through a series of calibration cycles for the stages of the DAC circuit using successive approximation to equalize a voltage signal generated by a signal generation circuit responsive to the binary digit signals with a calibration reference voltage signal associated with each of the stages.

13. A method of operating a Digital-to-Analog Converter (DAC) circuit comprising:
successively adjusting a biasing voltage signal to a stage of the DAC circuit responsive to a feedback signal generated during successive calibration cycles wherein a calibration reference voltage signal is compared to a series of voltage levels generated by the stage responsive to the successively adjusted biasing voltage signal.

14. A method according to claim 13 further comprising:
storing a value associated with the biasing voltage signal that generates an input voltage signal that is about equal to the calibration reference voltage signal in a Successive Approximation Register associated with the stage.

15. A method according to claim 13 wherein the calibration reference voltage signal comprises a first calibration reference voltage signal, the method further comprising:
repeating the successively adjusting the biasing voltage signal for other stages of the DAC circuit using other different calibration reference voltage signals.

16. A method according to claim 15 further comprising:
storing a other values associated with the biasing voltage signals that generate input voltage signals that are about equal to the other different calibration reference voltage signals applied to the different stages in respective Successive Approximation Register associated with the different stages.

17. A method according to claim 14 further comprising:
selecting a power supply voltage to be compared to an input voltage signal generated responsive to a binary digit signal applied to a current source circuit having the biasing voltage signal generated by the stored value during normal operation of the DAC.

* * * * *

UNITED STATES PATENT AND TRADEMARK OFFICE
CERTIFICATE OF CORRECTION

PATENT NO. : 7,145,493 B2  Page 1 of 1
APPLICATION NO. : 11/141536
DATED : December 5, 2006
INVENTOR(S) : Kee-Won Kwon It is certified that error appears in the above-identified patent and that said Letters Patent is hereby corrected as shown below:

Column 10, line 53, please change "storing a other values" to -- storing other values --.

Signed and Sealed this

Third Day of April, 2007

JON W. DUDAS
*Director of the United States Patent and Trademark Office*